(12) United States Patent
Takahashi (10) Patent No.: US 11,555,834 B2
(45) Date of Patent: Jan. 17, 2023

(54) MAGNETIC SENSOR AND METHOD OF MANUFACTURING SUCH, MAGNETIC CONTROL DEVICE, AND CURRENT SENSOR DESIGN METHOD

(71) Applicant: TDK Corporation, Tokyo (JP)

(72) Inventor: Makoto Takahashi, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 17/203,857

(22) Filed: Mar. 17, 2021

(65) Prior Publication Data

US 2021/0293858 A1    Sep. 23, 2021

(30) Foreign Application Priority Data

Mar. 19, 2020   (JP) .............................. JP2020-049376

(51) Int. Cl.
   *G01R 15/20*    (2006.01)
   *G01R 3/00*    (2006.01)
   *G01R 19/00*    (2006.01)

(52) U.S. Cl.
   CPC ............. *G01R 15/207* (2013.01); *G01R 3/00* (2013.01); *G01R 15/205* (2013.01); *G01R 19/0092* (2013.01)

(58) Field of Classification Search
   CPC .. G01R 15/207; G01R 15/205; G01R 15/202; G01R 3/00; G01R 33/0052; G01R 33/0076; G01R 33/093; G01R 33/098
   See application file for complete search history.

(56) References Cited

U.S. PATENT DOCUMENTS 9,417,269 B2 *   8/2016   Sakai ................. G01R 19/0092
2007/0164727 A1 *  7/2007   Racz ..................... G01R 15/207
                                                          324/235

(Continued)

FOREIGN PATENT DOCUMENTS

JP       2011-149827 A     8/2011
JP       2013-11469 A      1/2013
(Continued)

OTHER PUBLICATIONS

English machine translation of Japanese Office Action dated May 31, 2022 issued in corresponding JP Patent Application No. 2020-049376.

(Continued)

*Primary Examiner* — Dominic E Hawkins
(74) *Attorney, Agent, or Firm* — Posz Law Group, PLC (57) ABSTRACT

A current sensor includes a magnetic detection unit capable of detecting the magnetism, a first magnetic shield and a second magnetic shield. The first magnetic shield includes a first shield section and two second shield sections respectively connected in the vicinity of the two ends thereof. The second magnetic shield includes a third shield section and two fourth shield sections respectively connected in the vicinity of the two ends thereof. Between the first shield section and the third shield section is a conductor placement region, and the magnetic detection unit is positioned between the first shield section and the conductor placement region and is provided at a magnetic field canceling position where the magnetic field in the second direction is substantially zero at non-energized times after a prescribed current has flowed in the conductor, in relationship to the length of the two fourth shield sections along the third direction.

19 Claims, 8 Drawing Sheets

(56) References Cited

U.S. PATENT DOCUMENTS

| | | | |
|---|---|---|---|
| 2014/0111196 A1 | 4/2014 | Sakai et al. | |
| 2017/0131329 A1* | 5/2017 | Gorai | G01R 15/202 |
| 2018/0196088 A1* | 7/2018 | Ichinohe | G01R 15/205 |

FOREIGN PATENT DOCUMENTS

| | | |
|---|---|---|
| JP | 2013-117447 A | 6/2013 |
| JP | 2013-228315 A | 11/2013 |
| JP | 2016-148620 A | 8/2016 |
| JP | 2017-78577 A | 4/2017 |
| JP | 2019-164081 A | 9/2019 |

OTHER PUBLICATIONS

Office Action dated Sep. 13, 2022 issued in corresponding JP Patent Application No. 2020-049376 (English machine translation only).

* cited by examiner

MAGNETIC SENSOR AND METHOD OF MANUFACTURING SUCH, MAGNETIC CONTROL DEVICE, AND CURRENT SENSOR DESIGN METHOD

The present application is based on and claims priority from Japanese Patent Application No. 2020-49376 filed on Mar. 19, 2020, the disclosure of which is incorporated herein by reference.

BACKGROUND

The present invention relates to a magnetic sensor and method of manufacturing such, a magnetic control device and a current sensor design method.

In the past, current sensors have been used in battery level measurement, motor drive current measurement, and electric power control equipment such as converters, inverters or the like, in hybrid electric vehicles (HEV) and electric vehicles (EV) and the like. In such current sensors, current flowing in a conductor such as a bus bar or the like is detected in a non-contact state by a magnetic detection element such as an MR element, Hall element or the like, for example, In a current sensor, the magnetic field generated from the conductor due to the flowing of the current is detected by the magnetic detection element, but when a magnetic field is applied from outside on the magnetic detection element, the detection accuracy of the current sensor deteriorates. In order to control this deterioration of detection accuracy, providing a magnetic shield surrounding the periphery of the conductor and the magnetic detection element such as an MR element or Hall element has been proposed. In order to prevent deterioration of current detection accuracy when a magnetic field arising in the gap between two magnetic shields is applied diagonally on a magnetron conversion element, Patent Literature 1 discloses making the height position of the gap and the height position of the sensor substrate formed by the magnetron conversion element the same.

Patent Literature 1

JP Laid-Open Patent Application No. 2013-011469

By providing a magnetic shield as in the above-described conventional current sensor, it is possible for the magnetic shield to absorb magnetic fields from outside, so it is possible to control deterioration of the detection accuracy caused by such magnetic fields. On the other hand, at least a portion of the magnetic field generated by the current being measured that flows in the conductor such as the bus bar or the like is absorbed by the magnetic shield, but because a magnetic shield, which is made of a magnetic material, has a hysteresis property, even if the conductor is in a non-energized state, some magnetization remains in the magnetic shield. The magnetic field generated from the magnetic shield due to this residual magnetization causes the detection accuracy in the current sensor to deteriorate. By placing a magnetic detection element at the position where the magnetic field generated from the magnetic shield through residual magnetization is canceled and the magnetic field strength becomes zero, the detection accuracy in the current sensor can be improved. On the other hand, with greater thinness of current sensors being sought, because two U-shaped magnetic shields face each other in the above-described conventional current sensor, the size of the current sensor is uniquely determined by the size of the magnetic shields, making it difficult to achieve greater thinness of the current sensor.

SUMMARY

In consideration of the foregoing, it is an object of the present invention to provide a current sensor capable of reducing measurement errors when the conductor is not energized, improve measurement accuracy and increase thinness, and a method of manufacturing such, as well as a magnetic control device provided with this current sensor, and a current sensor design method.

In order to achieve this object, the present invention provides a current sensor used to detect magnetism generated from a conductor in which a current flows in a first direction, the current sensor includes: a magnetic detection unit, which is capable of detecting the magnetism, a first magnetic shield and a second magnetic shield. The first magnetic shield includes a first shield section and two continuous second shield sections, which are respectively in the vicinity of two ends of the first section. The second magnetic shield includes a third shield section and two continuous fourth shield sections, which are respectively in the vicinity of two ends of the third shield section. The first shield section and the third shield section face each other and are substantially parallel to each other. Between the first shield section and the third shield section, there is a conductor placement region in which the conductor is placed such that the first direction is substantially parallel to the first shield section. In the vicinity of the two ends of the first shield section in a second direction, which is orthogonal to the first direction, the two second shield sections are continuous toward the second magnetic shield and are substantially parallel to a third direction, which is orthogonal to the first direction and the second direction. In the vicinity of the two ends of the first shield section in a second direction, which is orthogonal to the first direction in the third shield section, the two fourth shield sections are continuous toward the first magnetic shield and are substantially parallel to the third direction, which is orthogonal to the first direction and the second direction. The length of the first shield section along the second direction is greater than the length of the third shield section along the second direction. The magnetic detection unit is positioned between the first shield section and the conductor placement region. The magnetic detection unit is provided at a magnetic field canceling position, at which the magnetic field in the second direction is substantially zero at non-energized times after a prescribed current has flowed in the conductor, in relation to the length of the two fourth shield sections along the third direction.

The magnetic field canceling position can be a position determined on the basis of the correlation between the length of the two fourth shield sections in the third direction and a distance from the conductor placement region along the third direction. The vicinity of the end of the fourth shield sections can overlap the second shield sections, when viewed along the second direction. The magnetic detection unit and the conductor placement region can be positioned within a space enclosed by the third shield section and the two fourth shield sections, when viewed along the first direction. The magnetic detection unit and the conductor placement region can be separated by 1.0 mm or more along the third direction. The magnetic detection unit and the first shield section may be separated by 1.0-2.0 mm along the third direction.

The current sensor can further include a circuit board having a first surface and a second surface, which is opposite to the first surface. The first surface of the circuit board faces the first shield section, and the second surface of the circuit board faces the third shield section. The magnetic detection unit is mounted on the second surface of the circuit board. A height adjustment unit can be provided between the magnetic detection unit and the second surface of the circuit board. A signal processing unit, which processes detection signals output from the magnetic detection unit, can be mounted on the second surface of the circuit board.

The current sensor may further comprise a circuit board having a first surface and a second surface, which is opposite the first surface. The first surface of the circuit board faces the first shield section, and the second surface of the circuit board faces the third shield section. The magnetic detection unit is mounted on the first surface of the circuit board. A signal processing unit that processes detection signals output from the magnetic detection unit can be mounted on the first surface of the circuit board.

The magnetic detection unit can include a magnetoresistive effect element or Hall element, and the magnetoresistive effect element may be a GMR element or a TMR element. The current sensor may further comprise a sealed unit that integrally seals the magnetic detection unit, the first magnetic shield and the second magnetic shield, wherein the conductor placement region is a penetrating hole into which the conductor can be inserted, formed in the sealed unit along the first direction, and the conductor may be placed in the conductor placement region.

In addition, the present invention provides an electric control device comprising the above-described current sensor.

In addition, the present invention provides a method for designing the above-described current sensor, the current design method being such that the magnetic field canceling position where the magnetic detection unit is provided within the current sensor is determined on the basis of the correlation between the length of the fourth shield section and the distance from the conductor along the third direction.

In addition, the present invention provides a method of manufacturing the above-described current sensor, the current sensor manufacturing method being such that the magnetic detection unit is provided at the magnetic field canceling position, which is determined on the basis of the correlation between the length of the fourth shield section and the distance from the conductor placement region along the third direction.

The conductor may be placed in the conductor placement region.

With the present invention, it is possible to provide a current sensor capable of reducing measurement errors when the conductor is not energized, improve measurement accuracy and increase thinness, and a method of manufacturing such, as well as a magnetic control device provided with this current sensor, and a current sensor design method.

DETAILED DESCRIPTION

Below, an embodiment of the present invention is described with reference to the drawings. The drawings are schematic or conceptual, and the dimensions of each of the members, the ratios of the sizes of the members and the like are not necessarily the same as those of the actual ones. In addition, even when the same member or the like is represented, there are times when the dimensions or ratios are expressed differently by the drawings. In addition, in the drawings attached to this specification, the shape, scale, aspect ratio, etc. of each part may be changed or exaggerated from the actual product in order to facilitate understanding.

In this embodiment, a "first direction," "second direction," and "third direction" are specified in a number of the drawings, as necessary. Here, the first direction is the direction of the current flowing in the conductor. The second direction is the direction of width of the conductor and is a direction orthogonal to the first direction. The third direction is the direction orthogonal to the first and second directions.

Figure 1:
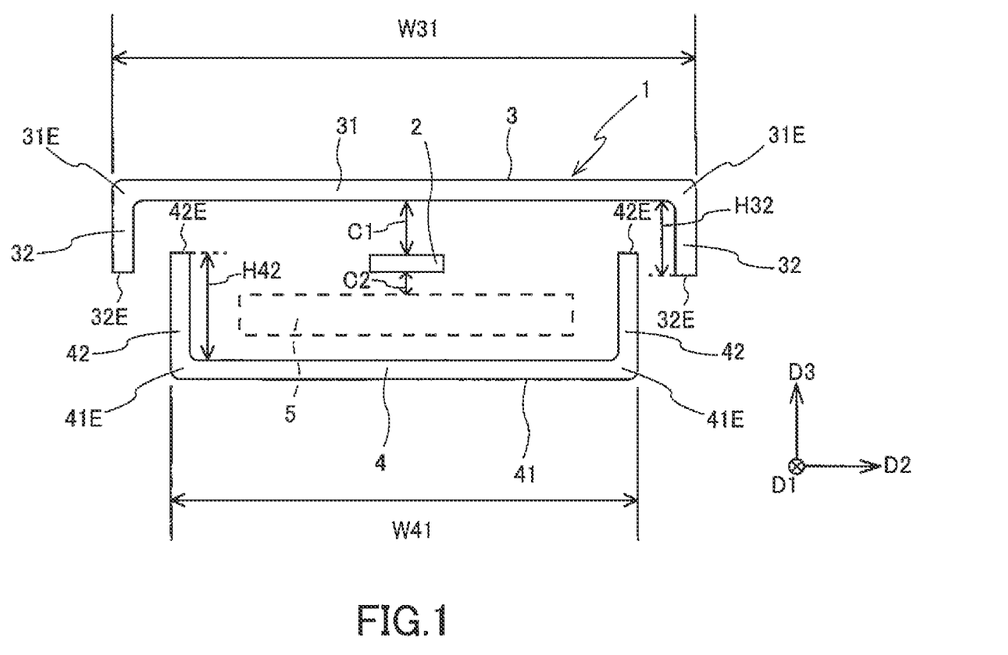
FIG. 1 is an end view showing a schematic configuration when the current sensor according to one embodiment of the present invention is viewed along a first direction.
Figure 2:
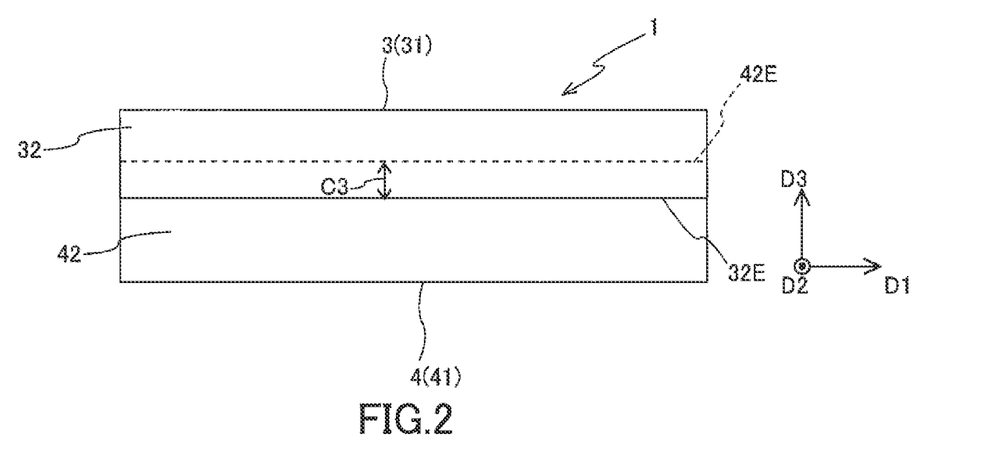
FIG. 2 is a side view showing the schematic configuration of the current sensor shown in FIG. 1 when viewed along a second direction.

FIG. 1 is a cut end view showing the schematic configuration when the current sensor according to an embodiment of the present invention is viewed along the first direction, and FIG. 2 is a side view showing the schematic configuration of the current sensor shown in FIG. 1 when viewed along a second direction. As shown in FIG. 1, a current sensor 1 comprises a magnetic detection unit 2 capable of detecting magnetism, a first magnetic shield 3 and a second magnetic shield 4.

The first magnetic shield 3 includes a first shield section 31 and a second shield section 32. The second shield section 32 is connected in the vicinity of each of two ends 31E of the first shield section 31 in a second direction D2 and extends toward the second shield 4 along a third direction D3. The second magnetic shield 4 includes a third shield section 41 and a fourth shield section 42. The fourth shield section 42 is connected in the vicinity of each of the two ends 41E of the third shield section 41 in the second direction D2 and extends toward the first shield 3 along the third direction D3. In this embodiment, the vicinity of both ends 31E of the first shield section 31 in the second direction D2 has a meaning that includes manufacturing errors and the like when the first shield 3 is manufactured, and means that, when the current sensor 1 is viewed along the first direction D1, within a range of around 4% of the length with respect to the width W31 of the first shield section 31 in the second direction D2, facing the inside of the first shield section 31 along the second direction D2 from the ends 31E of the first shield section 31. In addition, the vicinity of both ends 41E of the third shield section 41 has a meaning that includes manufacturing errors and the like when the second shield 4 is manufactured and means, when viewed along the first direction D1, within a range of around 5% of the length with respect to the width W41 of the third shield section 41 in the second direction D2, facing the inside of the third shield section 41 along the second direction D2 from the ends 41E of the third shield section 41.

The first shield section 31 and the third shield section 41 are positioned opposite and substantially parallel to each other. The first shield section 31 and the third shield section 41 being substantially parallel to each other has a meaning that includes manufacturing errors at the time of manufacturing the first shield 3 and the second shield 4 and means tolerating that a plane including the first shield section 31 and a plane including the third shield section 41 intersect such that the angle formed by the two plans is not more than 4°.

Figure 9:
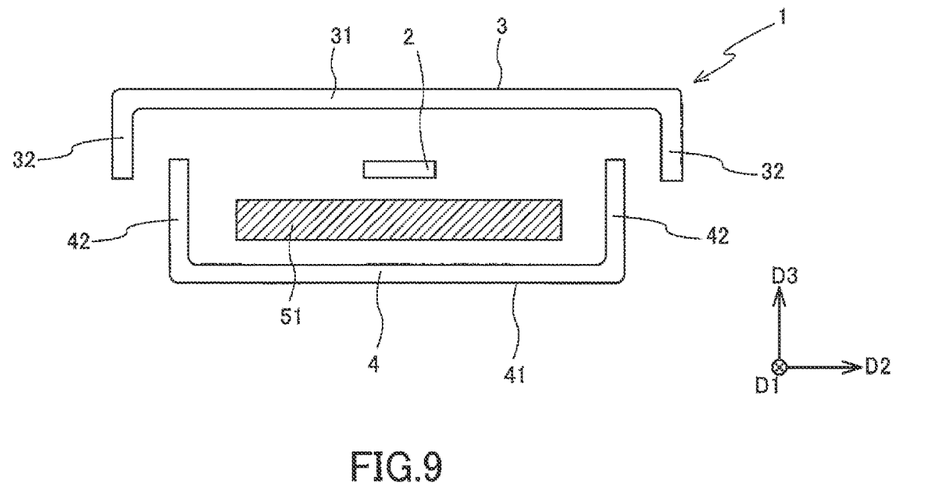
FIG. 9 is a cross-sectional view showing the schematic configuration when another aspect of the current sensor according to one embodiment of the present invention is viewed along the first direction.

A conductor placement region 5 where a conductor 51 (see FIG. 9) is positioned between the first shield section 31 and the third shield section 41. The conductor 51 can be placed in the conductor placement region 5 such that the lengthwise direction thereof is substantially parallel to the first direction D1. In a cross-section along the second direction D2 and the third direction D3 of the current sensor 1, the shape of the conductor placement region 5 is substantially rectangular, but this is intended to be illustrative and not limiting, for the shape of the conductor placement region 5 may be appropriately set in accordance with the shape of the conductor 51 to be placed in the conductor placement region 5. For example, the conductor placement region 5 may be a substantially circular shape or the like.

The lengthwise direction of the conductor 51 being substantially parallel to the first direction D1 has a meaning that includes manufacturing errors when manufacturing the current sensor 1 and has a meaning that includes tolerating the lengthwise direction of the conductor 51 intersecting the first direction D1 at an angle of not more than 2°, in the cross-section of the current sensor 1 taken along the second direction D2 and the third direction D3. In addition, when the conductor placement region 5 has a substantially circular shape, the meaning includes tolerating that the axial line of the conductor 51 (a line passing through the center of the conductor 51) intersects the first direction D1 at an angle of not more than 2°, in the cross-section along the second direction D2 and the third direction D3.

The two second shield sections 32 are substantially parallel to the third direction D3 from the vicinity of each of the two ends 31E of the first shield section 31 in the second direction D2 and are connected to face the second magnetic shield 4, and the ends 32E of the two second shield sections 32 are positioned on the second magnetic shield 4 side. The second shield section 32 being substantially parallel to the third direction D3 has a meaning that includes manufacturing errors or the like when manufacturing the first magnetic shield 3 or the like and has a meaning that tolerates an extension line of the second shield section 32 intersecting the third direction D3 at an angle of not more than 1°, when viewed along the second direction D2.

The two fourth shield sections 42 are substantially parallel to the third direction D3 toward the first magnetic shield 3 from the vicinity of each of the two ends 41E of the third shield section 41 in the second direction D2 of the third shield 41. The ends 42E of the two fourth shield sections 42 are positioned on the first magnetic shield 3 side of the first magnetic shield. The fourth shield section 42 being substantially parallel to the third direction D3 has a meaning that includes manufacturing errors or the like when manufacturing the second magnetic shield 4 or the like and has a meaning that tolerates an extension line of the fourth shield section 42 intersecting the third direction D3 at an angle of not more than 1°.

The length W31 of the first shield section 31 along the second direction D2 is longer than the length W41 of the third shield section 41 along the second direction D2. Preferably, the length W31 of the first shield section 31 is longer than the length W41 of the third shield section 41 to the extent that each of the two ends 42E of the fourth shield section 42 can be positioned within the space defined by the first shield section 31 and the second shield section 32. Because the first shield section 31 and the third shield section 41 have this kind of length relationship, when the first shield 3 and the second shield 4 are placed such that the center position of the second shield section 32 in the second direction D2 and the center position of the fourth shield section 42 in the second direction D2 coincide, it is possible to reduce the height of the current sensor 1 in the third direction D3.

Examples of the material of the first magnetic shield 3 and the second magnetic shield 4 in the present embodiment include magnetic materials such as pure iron, silicon steel, and permalloy alloy. The first magnetic shield 3 and the second magnetic shield 4 may be made of the same magnetic material, but the first magnetic shield 3 and the second magnetic shield 4 may also be made of mutually different magnetic materials.

The magnetic detection unit 2 is positioned between the first shield section 31 and the conductor placement region 5 (between in the third direction D3). The length C1 (length in the third direction D3) between the magnetic detection unit 2 and the first shield section 31 is on the order of 0-0.2 mm, and more preferably, on the order of 1.0-2.0 mm. In addition, the length C2 (length in the third direction D3) between the magnetic detection unit 2 and the conductor placement region 5 can be a distance that takes electrical insulation into consideration and, for example, can be 1.0 mm or greater.

The magnetic detection unit 2 is provided at a magnetic field canceling position where the residual magnetization in the second direction D2 becomes substantially zero after a prescribed current has flowed in the conductor 51, in relationship between the length H42 of the two fourth shield sections 42 in the third direction D3. The first magnetic shield 3 and the second magnetic shield 4, which are magnetic materials, have a hysteresis property. Consequently, after the magnetic field generated by the flowing of current in the conductor 51 has been absorbed by the first magnetic shield 3 and the second magnetic shield 4, even if the conductor 51 becomes non-energized, magnetization remains in the first magnetic shield 3 and the second magnetic shield 4. When the magnetization (residual magnetization) remaining in the first magnetic shield 3 and the second magnetic shield 4 is applied on the magnetic detection unit 2, even when the conductor 51 is in a state in which no current is flowing, a signal corresponding to this residual magnetization is output from the magnetic detection unit 2. In this embodiment, by having the magnetic detection unit 2 provided at the magnetic field canceling position, it is possible to reduce measurement errors during times of non-energizing of the conductor. As described below, the magnetic field canceling position can be a position determined on the basis of the relative relationship between the length H42 of the two fourth shield sections 42 in the third direction D3, and the length C2 from the conductor placement region 5 along the third direction D3.

When viewed along the first direction D1, the magnetic detection unit 2 and the conductor placement region 5 may be positioned within the space defined by the third shield section 41 and the two fourth shield sections 42. By thus positioning these members, it is possible to reduce measurement errors arising from residual magnetization when the conductor 51 is not energized, and it is also possible to reduce the dimensions of the current sensor 1 in the third direction, thereby making the current sensor 1 thinner.

As shown in FIG. 2, when viewed along the second direction D2, the vicinity of the ends 42E of the fourth shield section 42 may overlap with the vicinity of the ends 32E of the second shield section 32. As a result, it is possible to make the dimensions of the current sensor 1 in the third direction D3 smaller and to achieve greater thinness. In addition, because the vicinity of the ends 32E of the second shield section 32 and vicinity of the ends 42E of the fourth shield section 42 overlap, the magnetic field from outside the current sensor 1 (magnetic field along the second direction) is absorbed by the first magnetic shield 3 and the second magnetic shield 4, so it is possible to suppress measurement errors that might arise caused by external magnetic fields. The length C3 of the overlapping portion of the second shield section 32 and the fourth shield section 42 along the third direction D3 is not particularly limited. The ends 32E of the second shield section 32 and the ends 42E of the fourth shield section 42 may be positioned on planes parallel to the second direction D2.

Figure 5:
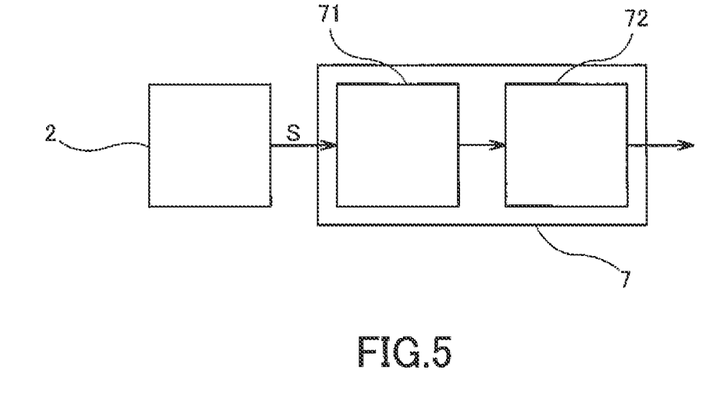
FIG. 5 is a block diagram showing the schematic configuration of the current sensor according to one embodiment of the present invention.
Figure 10:
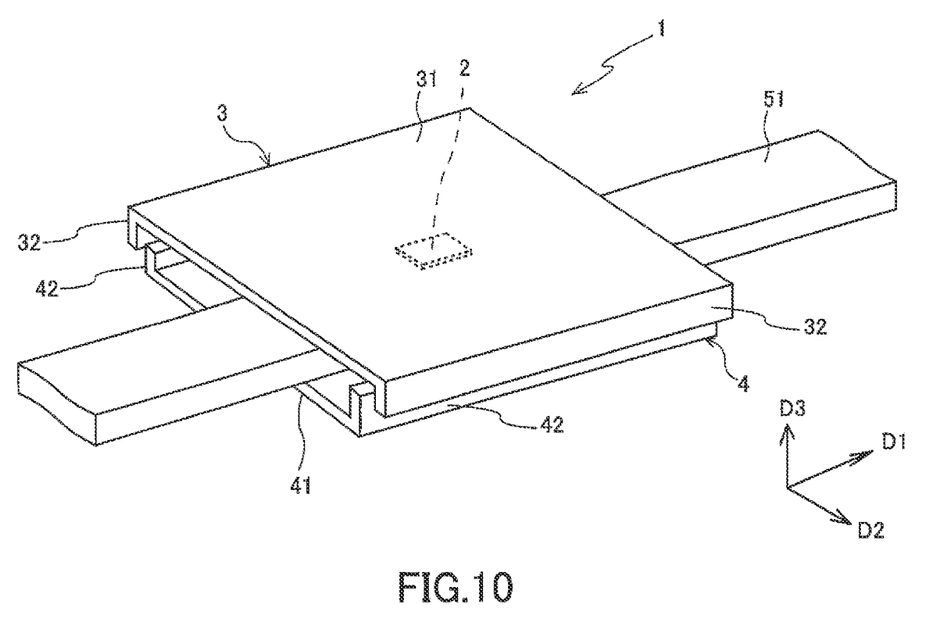
FIG. 10 is an oblique view showing the schematic configuration of the current sensor shown in FIG. 9.

FIG. 5 is a block diagram showing the schematic configuration of the current sensor according to this embodiment. As shown in FIG. 5, the current sensor 1 according to this embodiment (see FIG. 9 and FIG. 10) comprises a magnetic detection unit 2 and a signal processing unit 7. The signal processing unit 7 includes an analog-digital (A/D) converter 71, which converts an analog signal output from the magnetic detection unit 2 into a digital signal, and a calculation unit 72, which performs arithmetic processing on the digital signal converted to digital by the A/D converter 71. When the arithmetic processing results arithmetically processed by the calculation unit 72 are output as an analog signal, the signal processing unit 7 can also include a digital-analog (D/A) converter (undepicted) on the downstream side of the calculation unit 72.

Figure 6:
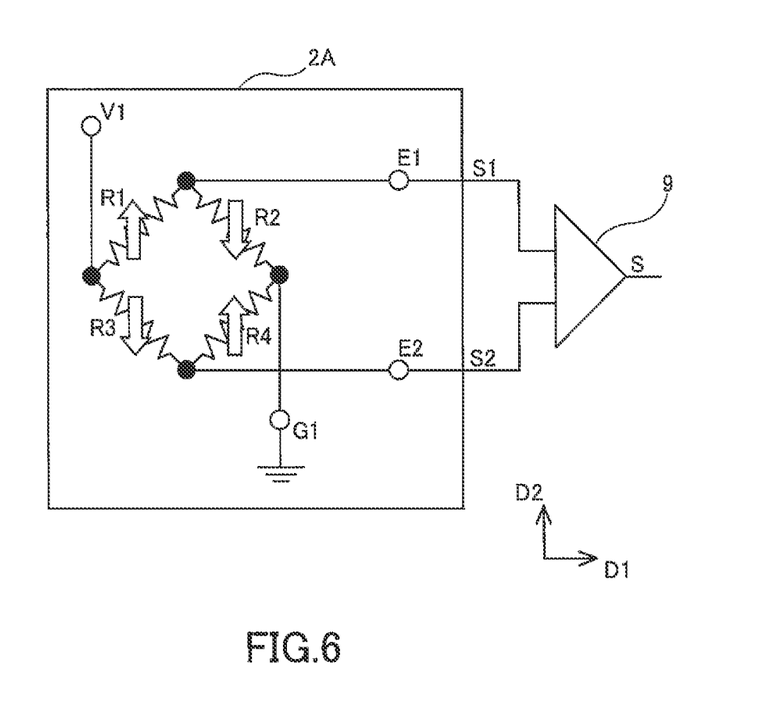
FIG. 6 is a circuit diagram showing the schematic configuration of one aspect of the circuit configuration possessed by the current sensor according to one embodiment of the present invention.
Figure 7:
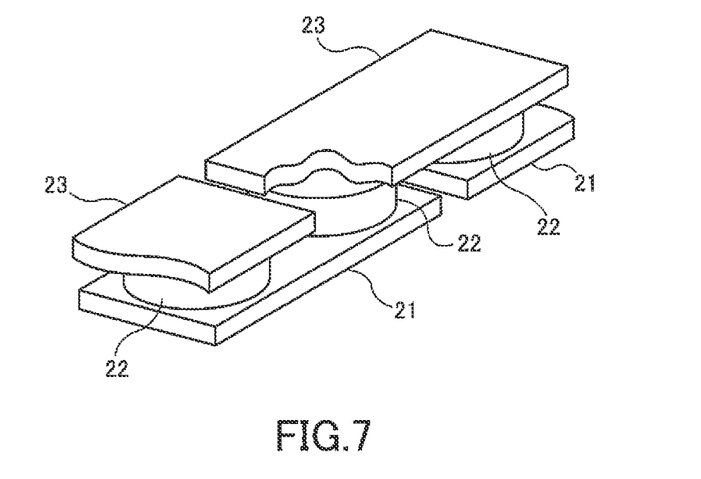
FIG. 7 is an oblique view showing the schematic configuration of a magnetoresistive effect element according to one embodiment of the present invention.
Figure 8:
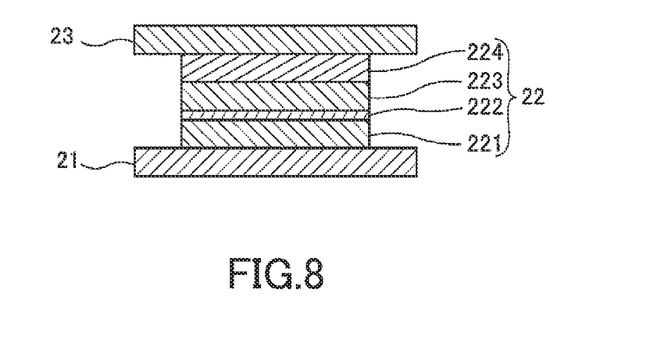
FIG. 8 is a cross-sectional view showing the schematic configuration of a magnetoresistive effect element according to one embodiment of the present invention.

FIG. 6 is a circuit diagram showing the schematic configuration of one aspect of the circuit configuration possessed by the current sensor according to this embodiment, FIG. 7 is an oblique view showing the schematic configuration of a magnetoresistive effect element according to this embodiment, and FIG. 8 is a cross-sectional view showing the schematic configuration of a magnetoresistive effect element according to this embodiment.

The magnetic detection unit 2 can include a magnetoresistive effect element. In this embodiment, the circuit configuration of the magnetic detection unit 2 can be a Wheatstone bridge circuit 2A in which four resistors, namely, a first resistor R1, a second resistor R2, a third resistor R3 and a fourth resistor R4, are bridge connected, and the first through fourth resistors R1-R4 can include a single magnetoresistive effect element or can include a plurality of magnetoresistive effect elements.

As shown in FIG. 6, the Wheatstone bridge circuit 2A included in the magnetic detection unit 2 includes a power source port V1, a ground port G1, two output ports E1 and E2, the first and second resistor R1 and R2, which are connected in series, and the third and fourth resistors R3 and R4, which are connected in series. One end of each of the first and third resistors R1 and R3 is connected to the power source port V1. The other end of the first resistor R1 is connected to one end of the second resistor R2 and to the output port E1. The other end of the third resistor R3 is connected to one end of the fourth resistor R4 and to the output port E2. The other end of each of the second and fourth resistors R2 and R4 is connected to the ground port G1. A power source voltage of prescribed magnitude is applied on the power source port V1, and the ground port G1 is connected to ground.

In this embodiment, the first through fourth resistors R1-R4 included in the Wheatstone bridge circuit 2A can be made of MR elements such as AMR elements, GMR elements, TMR elements, or the like, or can be made of Hall elements. GMR elements and TMR elements include a magnetization fixed layer, in which the magnetization direction is fixed, a free layer, the magnetization direction of which changes in accordance with changes in the applied magnetic field, and a non-magnetic layer, which is placed between the magnetization fixed layer and the free layer. AMR elements include a magnetic layer that has shape anisotropy.

As shown in FIG. 7 and FIG. 8, the MR elements that comprise the first through fourth resistors R1-R4, which are GMR elements or TMR elements or the like, can include a plurality of lower electrodes 21, a plurality of MR films 22 and a plurality of upper electrodes 23. The plurality of lower electrodes 21 is provided on a substrate (undepicted). Each of the lower electrodes 21 has a long, slender shape. A gap is formed between two lower electrodes 21 adjacent in the lengthwise direction of the lower electrodes 21. The MR films 22 are provided in the vicinity of each of the two ends in the lengthwise direction on the top surface of the lower electrodes 21.

The MR films 22 have a roughly circular shape in the planar view and include a free layer 221, a nonmagnetic layer 222, a magnetization fixed layer 223 and an antiferromagnetic layer 224, which are layered in that order from the lower electrode 21 side. The free layer 221 is electrically connected to the lower electrode 21. The antiferromagnetic layer 224 is composed of an antiferromagnetic material and, by being caused to exchange-couple with the magnetization fixed layer 223, serves the role of fixing the direction of magnetization of the magnetization fixed layer 223. The plurality of upper electrodes 23 is provided on the plurality of MR films 22. Each of the upper electrodes 23 has a long, slender shape, is positioned on two of the lower electrodes 21 adjacent in the lengthwise direction of the lower electrodes 21 and electrically connects the antiferromagnetic layer 224 of two adjacent MR films 22. The MR film 22 can have a configuration in which the free layer 221, the nonmagnetic layer 222, the magnetization fixed layer 223 and the antiferromagnetic layer 224 are layered in that order form the upper electrode 23 side. In addition, the antiferromagnetic layer 224 may be omitted if the magnetization fixed layer 223 is a so-called self-pinned fixed layer (Synthetic Ferri Pinned layer, or SFP layer) having a layered ferri structure of a ferromagnetic layer/nonmagnetic intermediate layer/ferromagnetic layer in which both ferromagnetic layers are antiferromagnetically coupled.

In TMR elements, the nonmagnetic layer 222 is a tunnel barrier layer. In GMR elements, the nonmagnetic layer 222 is a nonmagnetic electroconductive layer. In TMR elements and GMR elements, the resistance value changes in accordance with the angle formed by the direction of magnetization of the free layer 221 with respect to the direction of magnetization of the magnetization fixed layer 223, and the resistance value is a minimum when this angle is 0° (when the magnetization directions are parallel to each other), and the resistance value is a maximum when this angle is 180° (when the magnetization directions are antiparallel to each other).

As shown in FIG. 6, when the first through fourth resistors R1-R4 are made of TMR elements or GMR elements, in the Wheatstone bridge circuit 2A of the magnetic detection unit 2, the magnetization directions of the magnetization fixed layers 223 of the first and second resistors R1 and R2 are parallel to the second direction D2, and the magnetization direction of the magnetization fixed layer 223 of the first resistor R1 and the magnetization direction of the magnetization fixed layer 223 of the second resistor R2 are antiparallel to each other. In addition, the magnetization directions of the magnetization fixed layers 223 of the third and fourth resistors R3 and R4 are parallel to the second direction D2, and the magnetization direction of the magnetization fixed layer 223 of the third resistor R3 and the magnetization direction of the magnetization fixed layer 223 of the fourth resistor R4 are antiparallel to each other. In the magnetic detection unit 2, the potential difference between the output ports E1 and E2 changes in accordance with changes in the magnetic field strength of the magnetic field in the second direction D2 generated from the conductor 51, and a sensor signal S is output to the signal processing unit 7 as a signal indicating the magnetic field strength. The signal corresponding to the potential difference between the output ports E1 and E2 is output to the signal processing unit 7 as the sensor signal S. A difference detector 9 amplifies the signals S1 and S2 corresponding to the potential difference between the output ports E1 and E2 and outputs this as the sensor signal S to the A/D converter 71 of the signal processing unit 7.

The A/D converter 71 converts the sensor signal S (an analog signal related to the amount of movement) output from the magnetic detection unit 2 into a digital signal, and this digital signal is input into the calculation unit 72. The calculation unit 72 accomplishes arithmetic processing on the digital signal converted from an analog signal by the A/D converter 71. The calculation unit 72 is made of a microcomputer, an Application Specific Integrated Circuit (ASIC), or the like, for example.

In this embodiment, the magnetic detection unit 2 is described as having an MR element, but this is intended to illustrative and not limiting, for it can be a Hall element or the like.

Figure 3A:
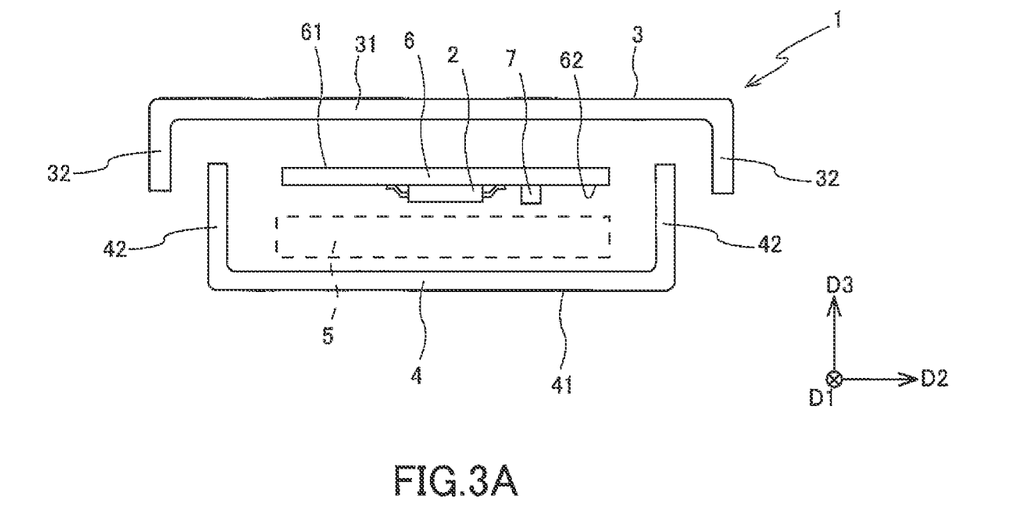
FIG. 3A is an end view showing a schematic configuration when another aspect of the current sensor according to one embodiment of the present invention is viewed along the first direction.
Figure 3B:
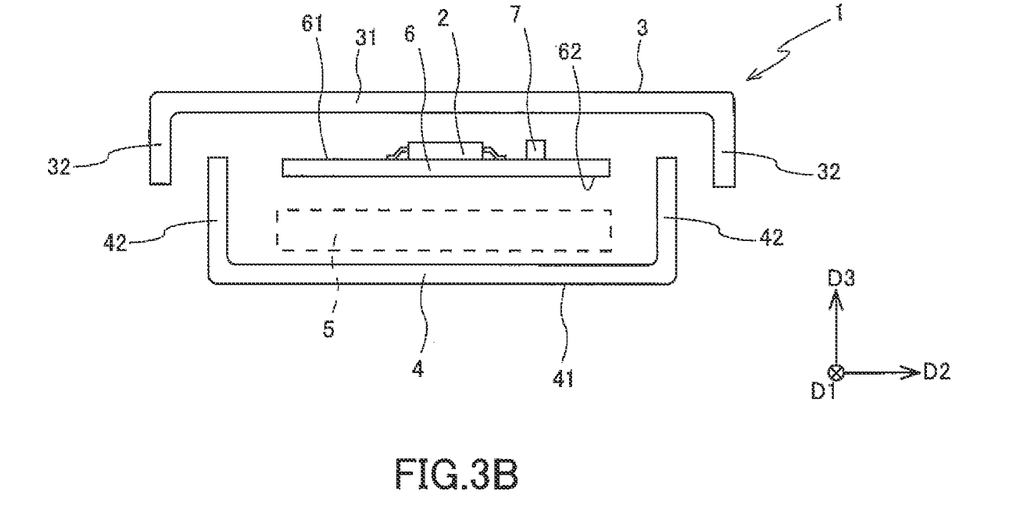
FIG. 3B is a cut end view showing a schematic configuration when another aspect of the current sensor according to one embodiment of the present invention is viewed along the first direction.

FIG. 3A is an end view showing the schematic configuration of another aspect of the current sensor according to this embodiment. The current sensor 1 shown in FIG. 3A is further provided with a circuit board 6 having a first surface 61 and a second surface 62, which is opposite the first surface 61. The first surface 61 of the circuit board 6 is opposite to the first shield section 31, and the second surface 62 of the circuit board 6 is opposite to the third shield section 41. In this embodiment, the magnetic detection unit 2 is mounted on the second surface 62 of the circuit board 6 but can also be mounted on the first surface 61 of the circuit board 6 (see FIG. 3B). In this aspect, the length of the circuit board 6 in the second direction D2 is less than the length W42 of the fourth shield section 42, and if the magnetic detection unit 2 is mounted on the second surface 62 of the circuit board 6, the magnetic detection unit 2 and the circuit board 6 are readily positioned within the space defined by the third shield section 41 and the fourth shield section 42. By promoting thinness of the current sensor 1, it is possible to secure surface area for mounting the electronic components of the signal processing unit 7 or the like on the first surface 61 of the circuit board 6 even if surface area for mounting the electronic components other than the magnetic detection unit 2 on the second surface 62 of the circuit board 6 cannot be adequately secured.

Figure 4A:
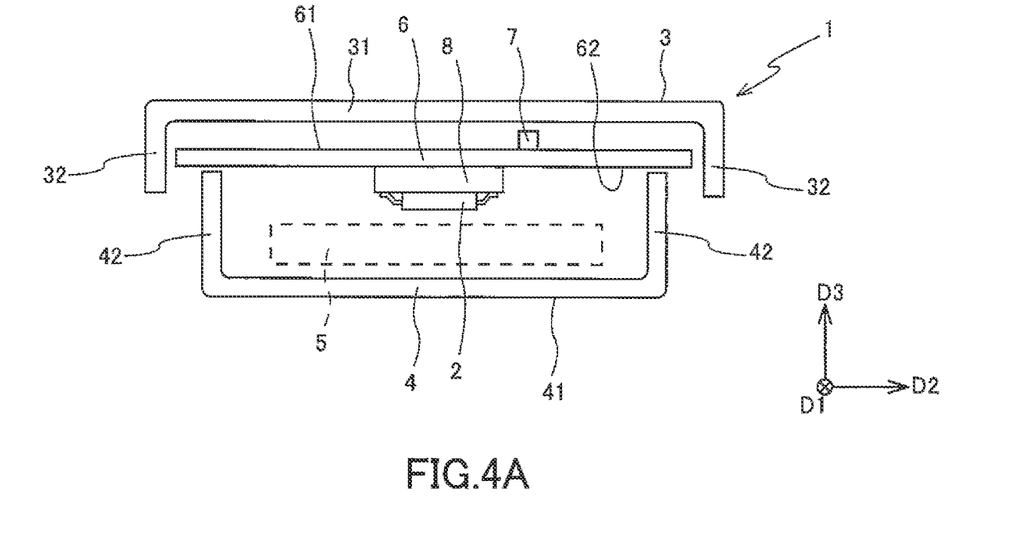
FIG. 4A is an end view showing a schematic configuration when another aspect of the current sensor according to one embodiment of the present invention is viewed along the first direction.

FIG. 4A is a cut away view showing the schematic configuration of another aspect of the current sensor according to this embodiment. The current sensor 1 shown in FIG. 4A includes a height adjustment unit 8 provided between the magnetic detection unit 2 and the second surface 62 of the circuit board 6. By providing the height adjustment unit 8 between the magnetic detection unit 2 and the second surface 62 of the circuit board 6, it is possible to cause the magnetic detection unit 2 to be positioned in the space defined by the third shield section 41 and the two fourth shield sections 42, to cause the circuit board 6 to be positioned in the space surrounded by the first shield 31 and the two second shield sections 32 and to make the length of the circuit board 6 in the second direction D2 greater than the length of the third shield section 41 in the second direction D2. As a result, a larger surface area for mounting the electronic components of the signal processing unit 7 and the like on the first surface 61 and the second surface 62 of the circuit board 6 can be secured, compared to the embodiment shown in FIG. 3A.

Figure 4B:
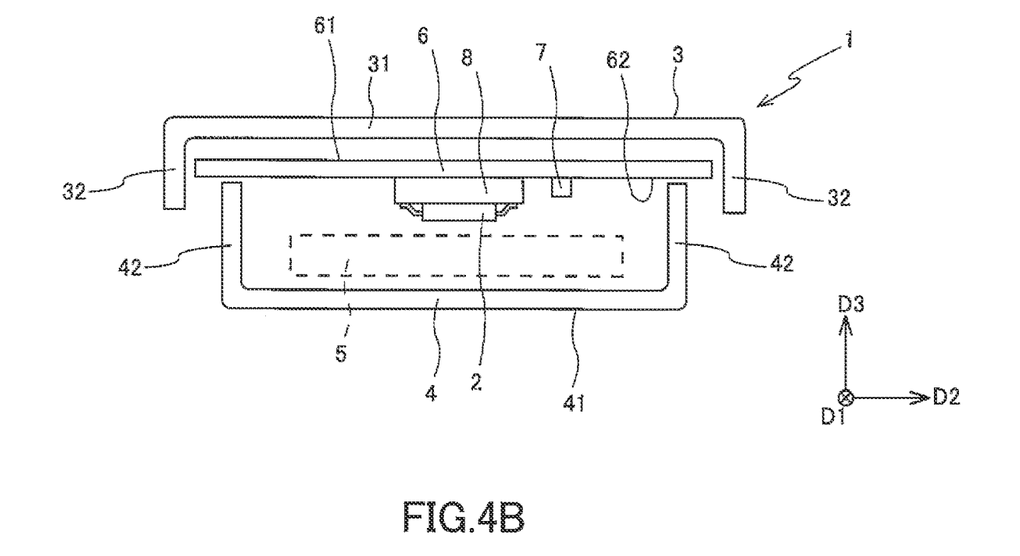
FIG. 4B is a cut end view showing a schematic configuration when another aspect of the current sensor according to one embodiment of the present invention is viewed along the first direction.

An embodiment in which the signal processing unit 7 is mounted on the first surface 61 of the circuit board 6 was described, but this is intended to be illustrative and not limiting, for the electronic components of the signal processing unit 7 and the like that process the detection signals output from the magnetic detection unit 2 may also be mounted on the second surface 62 of the circuit board 6 (see FIG. 4B).

Figure 13:
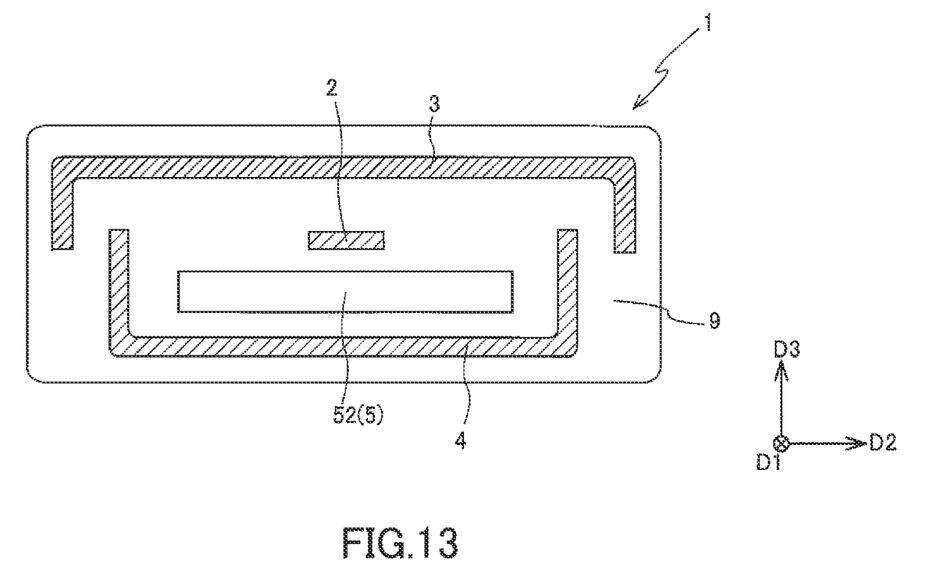
FIG. 13 is a cut end view showing a schematic configuration when another aspect of the current sensor according to one embodiment of the present invention is viewed along the first direction.

The current sensor 1 can further comprise a sealed unit 9 (see FIG. 13) that integrally seals the magnetic detection unit 2, the first magnetic shield 3 and the second magnetic shield 4. The sealed unit 9 possessed by the current sensor 1 can be one in which the magnetic detection unit 2, the first magnetic shield 3 and the second magnetic shield 4 can be integrally sealed and protected. For example, the sealed unit 9 can consist of resin or resin into which glass fibers have been mixed, or the like. The sealed unit 9 can be one (a housing) that holds the magnetic detection unit 2 (the circuit board 6 on which the magnetic detection unit 2 is mounted), the first magnetic shield 3, the second magnetic shield 4 and the conductor 51 (see FIG. 9). In this embodiment, the conductor placement region 5 can be provided in the sealed part as a penetrating hole 52 into which the conductor can be inserted along the first direction D1.

In the current sensor 1 described above, by placing the conductor 51 in the conductor placement region 5, it is possible to detect magnetism generated from the conductor 51 through which current flows in the first direction D1. As the conductor 51 placed in the conductor placement region 5, the material and shape properties are not particularly limited as long as this is the route of the current being measured. Examples of the material for the conductor 51 of the current sensor 1 of this embodiment include copper, aluminum, or the like. In addition, as the conductor 51 of the current sensor 1 of this embodiment, the current path is not particularly limited. Examples of the conductor 51 include a flat bus bar or a substantially round electric line or the like, but a flat bus bar is preferable from the perspective of thinness.

The current sensor 1 according to this embodiment (see FIG. 9 and FIG. 10) is provided in an electric control device. Examples of the electric control device of this embodiment include a battery management system, inverter and converter or the like of a hybrid electric vehicle (HEV) or an electric vehicle (EV), or the like. The current sensor 1 according to this embodiment is used to measure the amount of current input from a power source and to output information relating to the measured current to the electric control device.

Figure 11:
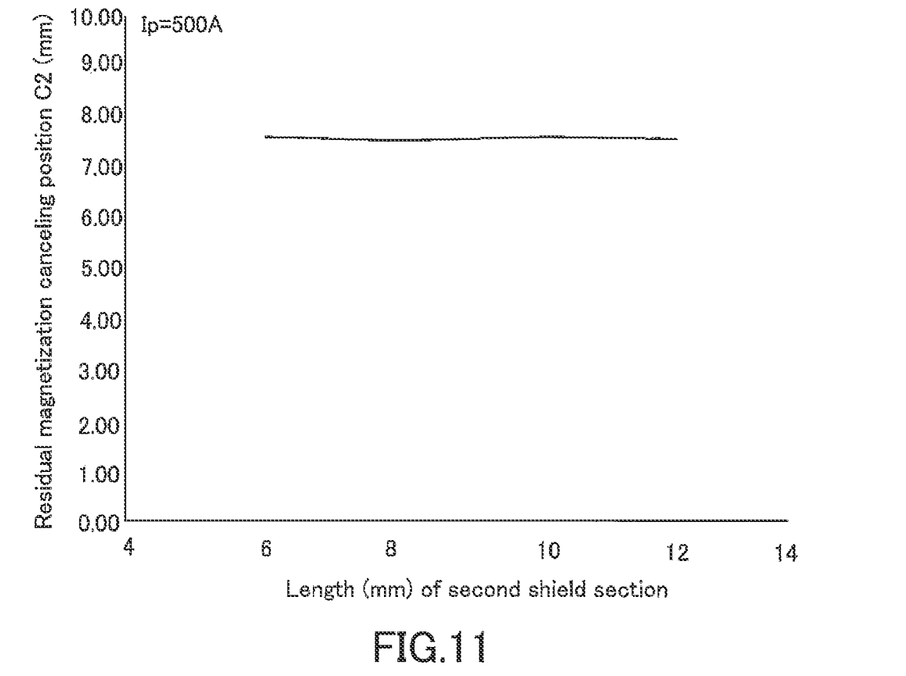
FIG. 11 is a graph showing the correlation between the length of the second shield section and the magnetic field canceling position in the current sensor according to this embodiment.
Figure 12:
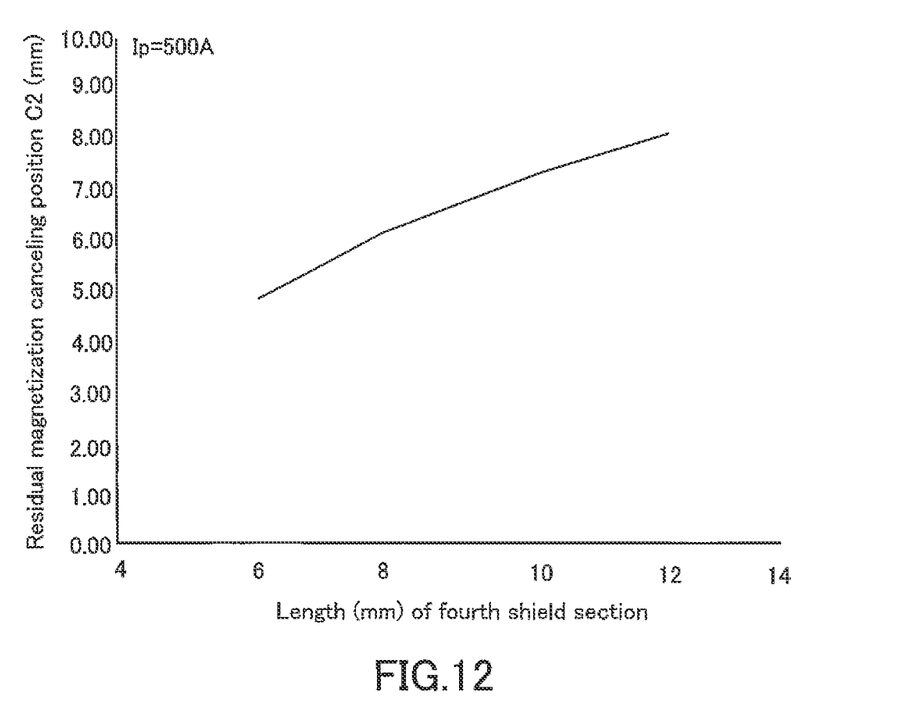
FIG. 12 is a graph showing the correlation between the length of the fourth shield section and the magnetic field canceling position in the current sensor according to this embodiment.

FIG. 11 is a graph showing the correlation between the length of the second shield section and the magnetic field canceling position when measuring a 500 A current in a conductor of the current sensor according to this embodiment, and FIG. 12 is a graph showing the correlation between the length of the fourth shield section and the magnetic field canceling position when measuring a 500 A current in a conductor of the current sensor according to this embodiment.

In the current sensor 1 according to this embodiment (see FIG. 9 and FIG. 10), the magnetic field canceling position has a correlation shown in FIG. 11 in relationship to the length H32 of the second shield section 32 (length in the third direction). That is, even if the length H32 of the second shield section 32 fluctuates, the magnetic field canceling position virtually does not fluctuate (see FIG. 11). On the other hand, the magnetic field canceling position has the correlation shown in FIG. 12 in relationship to the length H42 of the fourth shield section 42 (the length in the third direction). That is, when the length H42 of the fourth shield section 42 is caused to fluctuate, the magnetic field canceling position also fluctuates accordingly (see FIG. 12). Therefore, the current sensor 1 is designed by determining the magnetic field canceling position, that is, the position where the magnetic detection unit 2 is positioned within the current sensor 1, on the basis of the correlation with the length H42 of the fourth shield section 42. Hence, the method of designing the current sensor according to this embodiment includes a procedure for determining the magnetic field canceling position, at which the magnetic detection unit 2 is provided within the current sensor 1, on the basis of the correlation between the length H42 of the fourth shield section 42 and the distance from the conductor 51 along the third direction D3. Through this design method of the current sensor, it is possible to reduce measurement errors when the conductor 51 is not energized, in the current sensor 1 produced on the basis of this design, by determining the magnetic field canceling position of the magnetic detection unit 2 within the current sensor.

The method of manufacturing the current sensor 1 according to this embodiment will now be described.

First, a circuit board 6 made of a paper phenol substrate, a glass substrate, an epoxy substrate, or the like, and a first magnetic shield 3 and a second magnetic shield 4 are provided, for example. The magnetic detection unit 2 can be mounted on the second surface 62 side of the circuit board 6.

Next, the first shield section 31 and the third shield section 41 are positioned to face each other and be substantially parallel to each other, and between the first shield section 31 and the third shield section 41, the circuit board 6 is placed such that the magnetic detection unit 2 is caused to be positioned on the second magnetic shield 4 side. When placing the circuit board 6, the magnetic detection unit 2 is provided at the magnetic field canceling position determined based on the correlation with the length H42 of the fourth shield section 42 (see FIG. 12). In this manner, the current sensor 1 according to this embodiment can be manufactured. In addition, the conductor 51 can be placed in the conductor placement region 5 (see FIG. 9 and FIG. 10).

The embodiment as described above was disclosed in order to facilitate understanding of the present invention and not to limit the present invention. Accordingly, each element disclosed in the above-described embodiment shall be interpreted to include all design modifications and equivalents falling within the technical scope of the present invention.

In this embodiment, the description used an embodiment in which the magnetic detection unit 2 is provided on the second surface 62 of the circuit board 6, but this is intended to be illustrative and not limiting. For example, when the magnetic detection unit 2 is mounted in a single in-line package (SIP) type of package, the magnetic detection unit 2 may be provided on the first surface 61 of the circuit board 6. In this kind of configuration, the length C1 between the magnetic detection unit 2 and the first shield section 31 is preferably 1.0-2.0 mm.

DESCRIPTION OF SYMBOLS

1 Current sensor
2 Magnetic detection unit
3 First magnetic shield
31 First shield section
32 Second shield section
4 Second magnetic shield
41 Third shield section
42 Fourth shield section
5 Conductor placement region

The invention claimed is:
1. A current sensor used to detect magnetism generated from a conductor in which a current flows in a first direction, the current sensor comprising:
   a magnetic detection unit, which is capable of detecting the magnetism, a first magnetic shield and a second magnetic shield;

wherein the first magnetic shield includes a first shield section and two continuous second shield sections, which are respectively in the vicinity of two ends of the first shield section;

the second magnetic shield includes a third shield section and two continuous fourth shield sections, which are respectively in the vicinity of two ends of the third shield section;

the first shield section and the third shield section are positioned to face each other and are substantially parallel to each other;

a conductor placement region exists between the first shield section and the third shield section, the conductor placement region is a region in which the conductor is placed such that the first direction is substantially parallel to the first shield section;

in the vicinity of the two ends of the first shield section in a second direction, which is orthogonal to the first direction, the two second shield sections are continuous toward the second magnetic shield and are substantially parallel to a third direction, which is orthogonal to the first direction and the second direction;

in the vicinity of the two ends of the third shield section in a second direction, which is orthogonal to the first direction, the two fourth shield sections are continuous toward the first magnetic shield and are substantially parallel to the third direction, which is orthogonal to the first direction and the second direction;

the length of the first shield section along the second direction is greater than the length of the third shield section along the second direction;

the magnetic detection unit is positioned between the first shield section and the conductor placement region; and the magnetic detection unit is provided at a magnetic field canceling position, at which the magnetic field in the second direction is substantially zero at non-energized times after a prescribed current has flowed in the conductor, in relation to the length of the two fourth shield sections along the third direction.

2. The current sensor according to claim 1, wherein the magnetic field canceling position is a position determined on the basis of a correlation between the length of the two fourth shield sections in the third direction and a distance from the conductor placement region to the magnetic field canceling position along the third direction.

3. The current sensor according to claim 1, wherein the vicinity of the end of the fourth shield sections overlaps with the second shield sections, when viewed along the second direction.

4. The current sensor according to claim 1, wherein the magnetic detection unit and the conductor placement region are positioned within a space enclosed by the third shield section and the two fourth shield sections, when viewed along the first direction.

5. The current sensor according to claim 1, wherein the magnetic detection unit and the conductor placement region are separated by 1.0 mm or more along the third direction.

6. The current sensor according to claim 1, wherein the magnetic detection unit and the first shield section are separated by 1.0-2.0 mm along the third direction.

7. The current sensor according to claim 1, further comprising a circuit board having a first surface and a second surface, which is opposite to the first surface, wherein:

the first surface of the circuit board faces the first shield section;

the second surface of the circuit board faces the third shield section; and the magnetic detection unit is mounted on the second surface of the circuit board.

8. The current sensor according to claim 7, wherein a height adjustment unit is provided between the magnetic detection unit and the second surface of the circuit board.

9. The current sensor according to claim 7, wherein a signal processing unit, which processes detection signals output from the magnetic detection unit, is mounted on the second surface of the circuit board.

10. The current sensor according to claim 1, further comprising a circuit board having a first surface and a second surface, which is opposite to the first surface, wherein:

the first surface of the circuit board faces the first shield section;

the second surface of the circuit board faces the third shield section; and the magnetic detection unit is mounted on the first surface of the circuit board.

11. The current sensor according to claim 10, wherein a signal processing unit, which processes detection signals output from the magnetic detection unit, is mounted on the first surface of the circuit board.

12. The current sensor according to claim 1, wherein the magnetic detection unit includes a magnetoresistive effect element or a Hall element.

13. The current sensor according to claim 12, wherein the magnetoresistive effect element is a GMR element or a TMR element.

14. The current sensor according to claim 1, further comprising a sealed unit that integrally seals the magnetic detection unit, the first magnetic shield and the second magnetic shield, wherein the conductor placement region is a penetrating hole into which the conductor can be inserted, formed in the sealed unit along the first direction.

15. The current sensor according to claim 1, wherein the conductor is placed in the conductor placement region.

16. An electric control device comprising the current sensor according to claim 15.

17. A method for designing the current sensor according to claim 15, wherein the current sensor design method includes a step of determining a distance along the third direction between the conductor and the magnetic field canceling position based on the length of the fourth shield section.

18. A method of manufacturing the current sensor according to claim 1, wherein the current sensor manufacturing method includes a step of providing the magnetic detection unit at the magnetic field canceling position, which is determined based on a correlation between a length of the fourth shield section and a distance from the conductor placement region along the third direction.

19. The current sensor manufacturing method according to claim 18, further including a step of placing the conductor in the conductor placement region.

* * * * *